(12) United States Patent
Wehella-Gamage et al.

(10) Patent No.: US 8,546,219 B2
(45) Date of Patent: Oct. 1, 2013

(54) REDUCING PERFORMANCE VARIATION OF NARROW CHANNEL DEVICES

(75) Inventors: Deepal Wehella-Gamage, Newburgh, NY (US); Viorel Ontalus, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/272,340

(22) Filed: Oct. 13, 2011

(65) Prior Publication Data

US 2013/0095619 A1 Apr. 18, 2013

(51) Int. Cl.
H01L 21/336 (2006.01)

(52) U.S. Cl.
USPC .................................. 438/270; 257/E21.628

(58) Field of Classification Search
USPC ................. 438/300, 446, 589, 270, 303, 595; 257/E21.626, E21.628
See application file for complete search history.

(56) References Cited

U.S. PATENT DOCUMENTS

| | | | |
|---|---|---|---|
| 5,539,229 A | 7/1996 | Noble, Jr. et al. | |
| 5,741,738 A | 4/1998 | Mandelman et al. | |
| 5,777,370 A * | 7/1998 | Omid-Zohoor et al. | 257/374 |
| 5,786,255 A | 7/1998 | Yeh et al. | |
| 5,923,991 A | 7/1999 | Bronner et al. | |
| 5,950,090 A | 9/1999 | Chen et al. | |
| 5,989,978 A | 11/1999 | Peidous | |
| 6,110,787 A | 8/2000 | Chan et al. | |
| 6,175,144 B1 | 1/2001 | Gardner et al. | |
| 6,235,596 B1 | 5/2001 | Liao | |
| 6,277,710 B1 | 8/2001 | Kim et al. | |
| 6,300,172 B1 | 10/2001 | Ang et al. | |
| 6,316,815 B1 | 11/2001 | Tseng | |
| 6,319,794 B1 | 11/2001 | Akatsu et al. | |
| 6,501,131 B1 | 12/2002 | Divakaruni et al. | |
| 7,037,794 B2 | 5/2006 | Beintner et al. | |
| 2008/0248626 A1 | 10/2008 | Liu et al. | |
| 2009/0294894 A1 | 12/2009 | Dyer | |
| 2012/0217583 A1 | 8/2012 | Zhu et al. | |
| 2012/0261759 A1 * | 10/2012 | Zhu et al. | 257/368 |

FOREIGN PATENT DOCUMENTS

WO 2012055198 A1 5/2012

OTHER PUBLICATIONS

Combined Search and Examination Report under Section 17 and 18(3) dated Nov. 27, 2012 from UK Intellectual Property Office, Application No. GB1213195.9.
Lunenborg et al., "Sacrificial spacer technology for suppressed reverse narrow channel effects with shallow trench isolation," Proceeding of the 31st European Solid-State Device Research Conference, Sep. 11-13, 2001, pp. 423-426.

* cited by examiner

*Primary Examiner* — Quoc Hoang
(74) *Attorney, Agent, or Firm* — Yuanmin Cai (57) ABSTRACT

Embodiment of the present invention provides a method of forming transistors such as narrow channel transistors. The method includes creating a transistor region in a substrate; the transistor region being separated from rest of the substrate, by one or more shallow trench isolation (STI) regions formed in the substrate, to include a channel region, a source region, and a drain region; the STI regions having a height higher than the transistor region of the substrate; and the channel region having a gate stack on top thereof; forming spacers at sidewalls of the STI regions above the transistor region; creating recesses in the source region and the drain region with the spacers preserving at least a portion of material of the substrate underneath the spacers along sidewalls of the STI regions; and epitaxially growing source and drain of the transistor in the recesses.

17 Claims, 9 Drawing Sheets

REDUCING PERFORMANCE VARIATION OF NARROW CHANNEL DEVICES

FIELD OF THE INVENTION

The present invention relates generally to the manufacturing of semiconductor devices, and in particular, to the formation of transistors with embedded source/drain.

BACKGROUND

In the field of semiconductor device manufacturing, active semiconductor devices such as, for example, transistors are generally manufactured or fabricated through processes commonly known as front end of line (FEOL) technologies. A transistor may be, for example, a field-effect-transistor (FET) and may be more specifically a complementary metal-oxide-semiconductor (CMOS) FET. A FET may also be a p-type dopant doped PFET or an n-type dopant doped NFET. Recently, high-k metal gate (HKMG) semiconductor transistors have been introduced because of their superior performance over conventional poly-based CMOS-FET. In addition, a replacement metal gate (RMG) process has been developed to further enhance the performance of HKMG transistors.

It is generally known that performance of a transistor may be greatly improved by introducing stresses in the channel region of the transistor. This is mainly because stresses increase the mobility of carriers, either holes or electrons depending on the type of the transistor, thereby increasing the response speed of the transistor. There are many different approaches of applying stresses to the channel of a transistor. For example, a compressive or tensile stress liner may be applied to the top of the transistor which may convey the stress through the gate and surrounding areas to the channel. Alternatively, appropriate types of stressors may be formed or embedded in the source and drain regions of a transistor that apply stresses toward the channel in-between the source and drain regions.

In forming source and drain with embedded stressors, recesses are normally first created in the source and drain regions, followed by epitaxial growth of silicon-germanium (SiGe) for pFET and silicon-carbide (SiC) for nFET transistors. With the continuous scaling down of real estate for semiconductor devices, real estate for the source/drain regions become extremely small and/or narrow and often closely surrounded by shallow trench isolation (STI) regions.

SUMMARY

Embodiment of the present invention provides a method of forming transistors and in particular forming narrow width, narrow channel transistors where real estate is small which leads source and drain being formed in close proximity to surrounding shallow trench isolation (STI) regions. In addition, source and drain of the transistors are formed epitaxially and embedded in the substrate.

In one embodiment, the method includes creating a transistor region in a substrate; the transistor region being separated from rest of the substrate, by one or more shallow trench isolation (STI) regions formed in the substrate, to include a channel region, a source region, and a drain region; the STI regions having a height higher than the transistor region of the substrate; and the channel region having a gate stack on top thereof; forming spacers at sidewalls of the STI regions above the transistor region; creating recesses in the source and drain regions with the spacers preserving at least a portion of material of the substrate underneath the spacers along sidewalls of the STI regions; and epitaxially growing source and drain of the transistor in the recesses.

In one embodiment, substrate is a silicon-on-insulator (SOI) substrate having a silicon layer on top of an oxide layer, wherein creating the transistor region further includes depositing one or more layers on top of the silicon layer of the SOI substrate; creating one or more openings into the one or more layers as well as into the silicon layer of the SOI substrate underneath the one or more layers; and filling the one or more openings with oxide to create the one or more STI regions.

Furthermore, in one aspect, filling the one or more openings includes depositing oxide into the one or more openings until the oxide in the openings has a height higher than the one or more layers, wherein the depositing also causes oxide being deposited on top of the one or more layers; and applying a chemical-mechanical-polishing (CMP) process in removing the oxide on top of the one or more layers, wherein the CMP process stops at the one or more layers thereby creating a top surface of the STI regions that is coplanar with the one or more layers.

In one embodiment, creating the transistor region further includes removing portions of the one or more layers that is on top of the source and drain regions of the transistor region, wherein the source and drain regions being adjacent to the STI regions.

In another embodiment, creating the transistor region further includes depositing a layer of gate material on top of the one or more layers; depositing a hard mask layer on top of the layer of gate material; patterning the hard mask layer into a gate pattern; and forming a gate stack by transferring the gate pattern into the layer of gate material and the one or more layers underneath the layer of gate material, wherein the gate stack is formed on top of the channel region.

In one aspect, the hard mask layer is an integrated hard mask layer that includes a first oxide layer, a nitride layer on top of the first oxide layer, and a second oxide layer on top of the nitride layer.

In one embodiment, forming the spacers further includes removing the second oxide layer of the integrated hard mask layer; depositing a conformal dielectric layer covering the nitride layer of the integrated hard mask layer, the source and drain regions, and the STI regions; and applying a directional etching process in transforming the conformal dielectric layer into spacers at sidewalls of the STI regions.

Furthermore, in one aspect, at least one of the one or more layers on top of the SOI substrate is a high-k dielectric layer. In another aspect, epitaxially growing the source and drain of the transistor includes growing either silicon-germanium or silicon-carbide on top of silicon material of the silicon layer of the SOI substrate, wherein the STI regions are not exposed at sidewalls of the recesses.

BRIEF DESCRIPTION OF THE DRAWINGS

The present invention will be understood and appreciated more fully from the following detailed description of the invention, taken in conjunction with the accompanying drawings of which.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION OF PREFERRED EMBODIMENTS

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure embodiments of the invention.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

FIGS. 1-9 are demonstrative illustrations of a method of forming semiconductor devices in accordance with various embodiments of the present invention. In the below detailed description, steps of the method may be illustratively shown by a series of cross-sectional views of the semiconductor devices under manufacturing. Some well known steps and/or processes may be omitted in order not to obscure description of essence of the present invention.

Embodiment of the present invention includes forming one or more transistors or transistor devices on a semiconductor substrate. In particular, it includes forming narrow channel transistors where real estate is small which leads source and drain being formed in close proximity to surrounding shallow trench isolation (STI) regions. The source and drain are formed through an epitaxial growth process and are embedded in the substrate. In one embodiment, the transistors may be formed, for example, on a silicon-on-insulator (SOI) substrate. However, a person skilled in the art will appreciate that embodiment of the present invention is not limited in this respect and, without deviating from the spirit of the present invention other types of substrates may be used as well.

Figure 1:
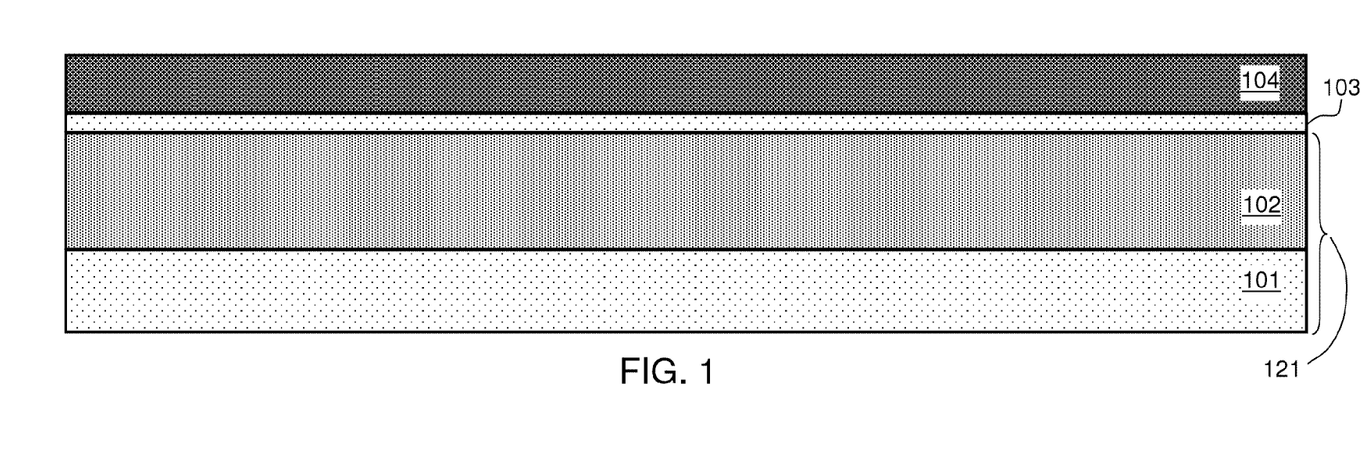
FIG. 1 is a demonstrative illustration of a method of forming one or more transistors according to one embodiment of the present invention.

More specifically, FIG. 1 demonstratively illustrates a silicon-on-insulator (SOI) substrate 121 that includes a silicon layer 102 on top of a bulk oxide (BOX) layer 101. According to one embodiment of the present invention, the method may include steps of forming a pad oxide layer 103 on top of silicon layer 102 of SOI substrate 121 and subsequently forming a pad nitride layer 104 on top of pad oxide layer 103. Pad nitride layer 104 may be formed, in one aspect, to have a thickness greater or thicker than usual. In other words, thickness of pad nitride layer 104 may be made thicker than those that would otherwise be required by known prior art processes. The formation of a thicker pad nitride 104 serves the purpose of, according to one embodiment, forming one or more shallow trench isolation (STI) regions that have a height higher than, or protruding, surrounding SOI substrate 120, as being depictured illustratively in FIG. 4. The exact height depends on a process of forming spacers at sidewalls of the STI regions as being discussed below in more details.

Figure 2:
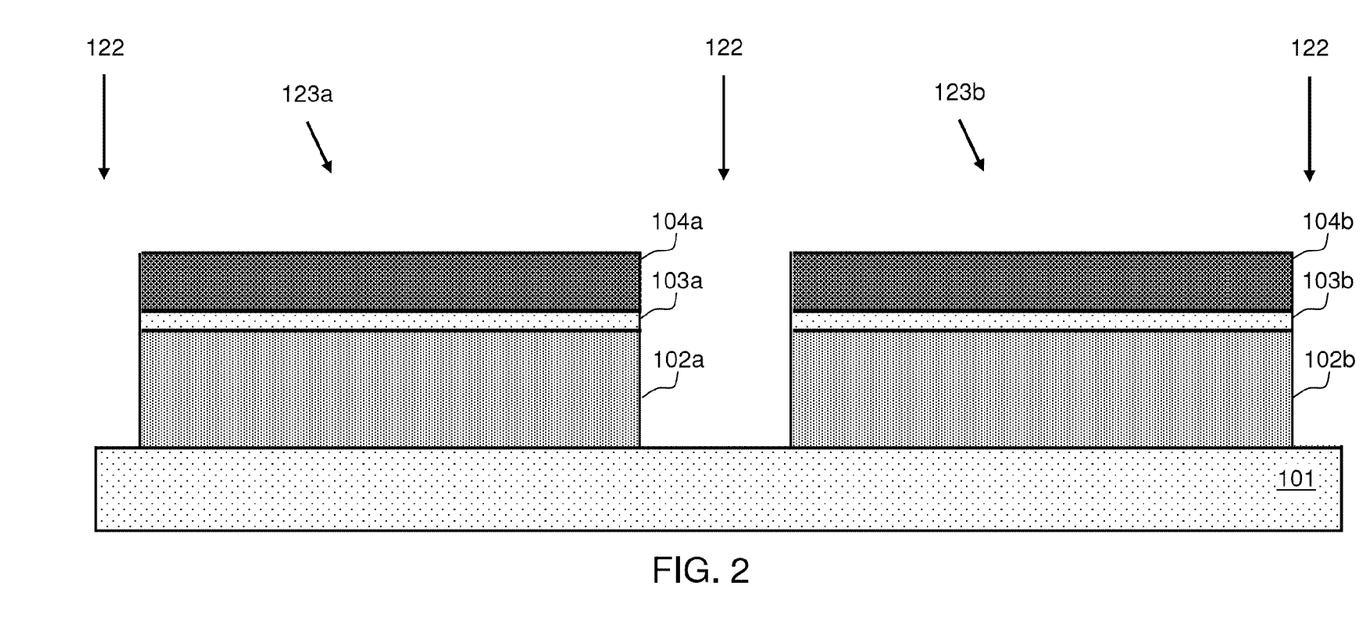
FIG. 2 is a demonstrative illustration of a method of forming one or more transistors, following the steps shown in FIG. 1, according to one embodiment of the present invention.

FIG. 2 is a demonstrative illustration of a method of forming one or more transistors, following the steps shown in FIG. 1, according to one embodiment of the present invention. For example, the method may include a step of forming hard or soft masks (not shown) of one or more RX patterns or patterns that represent one or more transistor regions on top of pad nitride layer 104. The patterning process may be made through, for example, a photo-lithographic patterning process. Next, with the one or more designated transistor regions being covered by and therefore protected by the hard or soft masks, the method may include a step of applying a directional etching process to create openings, such as openings 122, inside and/or into pad nitride layer 104, pad oxide layer 103 and underneath silicon layer 102 of SOI substrate 121. The directional etching may stop preferably at bulk oxide layer 101, thereby creating, as being illustrated in FIG. 2 as one example, two RX patterns or transistor regions 123a and 123b that include stacks of portions of layers 102, 103, and 104. More specifically, for example, transistor region 123a may include layers 102a, 103a, and 104a and transistor region 123b may include layers 102b, 103b, and 104b. The two RX patterns or transistor regions are separated by openings 122 from each other and from rest of substrate 121.

Figure 3:
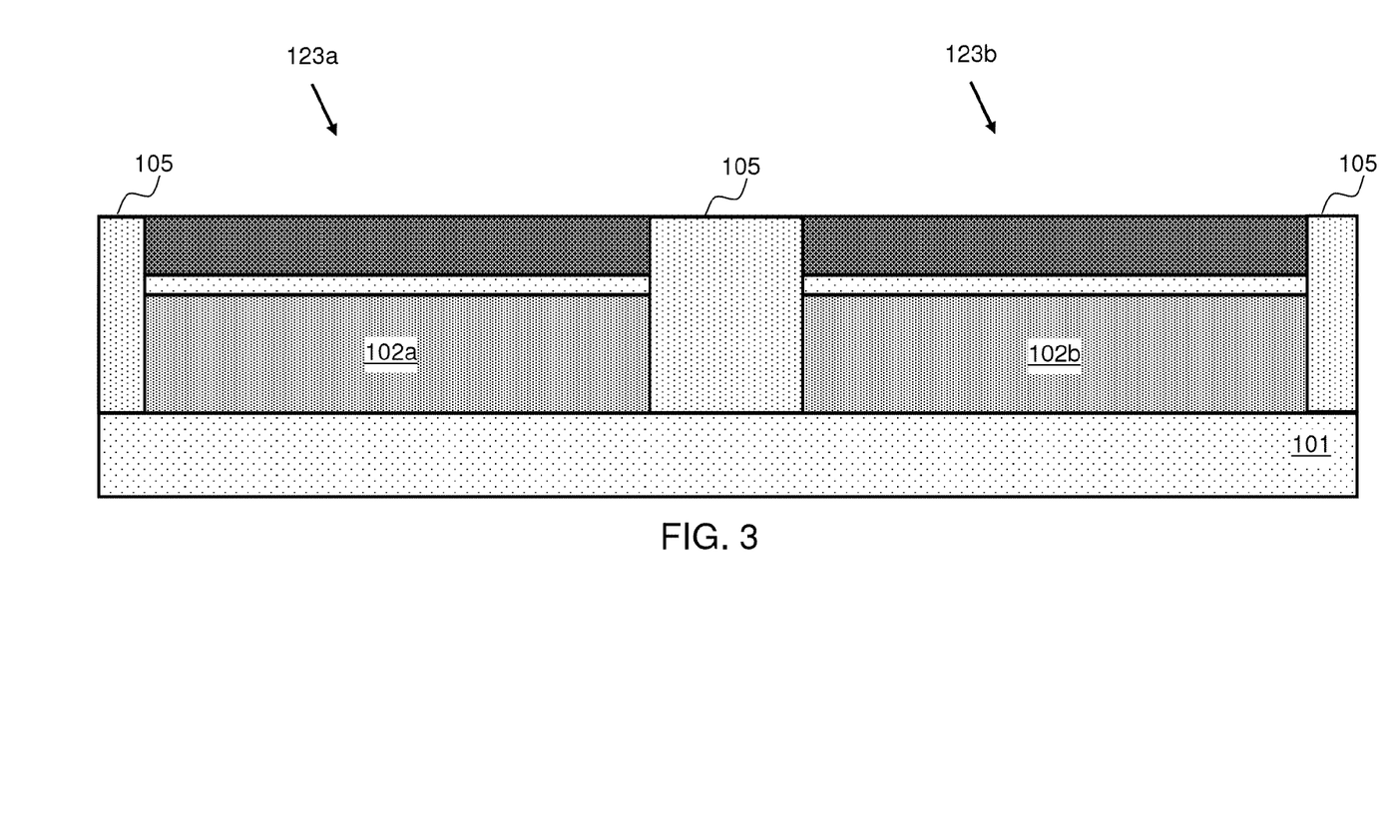
FIG. 3 is a demonstrative illustration of a method of forming one or more transistors, following the steps shown in FIG. 2, according to one embodiment of the present invention.

FIG. 3 is a demonstrative illustration of a method of forming one or more transistors, following the steps shown in FIG. 2, according to one embodiment of the present invention. Following the formation of RX patterns or transistor regions, one or more shallow trench isolation (STI) regions 105 may be formed inside substrate 121 around the RX patterns or transistor regions 123a and 123b to separate and/or isolate them from one another. STI regions 105 may be formed directly on top of oxide layer 101, inside openings 122 for example, to separate silicon region 102a from silicon region 102b. In other words as is shown in FIG. 3, transistor region 123a including silicon region 102a is defined and/or confined by a first STI region 105 to its left side and a second STI region 105 to its right side. Similarly, transistor region 123b including silicon region 102b is defined and/or confined by two STI regions at its left and right sides.

The formation of STI regions 105 may be made through, for example, a deposition process such as a high density plasma (HDP) deposition process, although other method of forming oxide layer may be used as well. During the deposition of HDP oxide, in addition to filling openings 122 with oxide, excess oxide may be deposited on top of pad nitride layers 104a and 104b. The excess oxide may be removed subsequently through, for example, a polishing technique by applying a chemical-mechanic-polishing (CMP) process. The CMP process may stop at pad nitride layers 104a and 104b.

Figure 4:
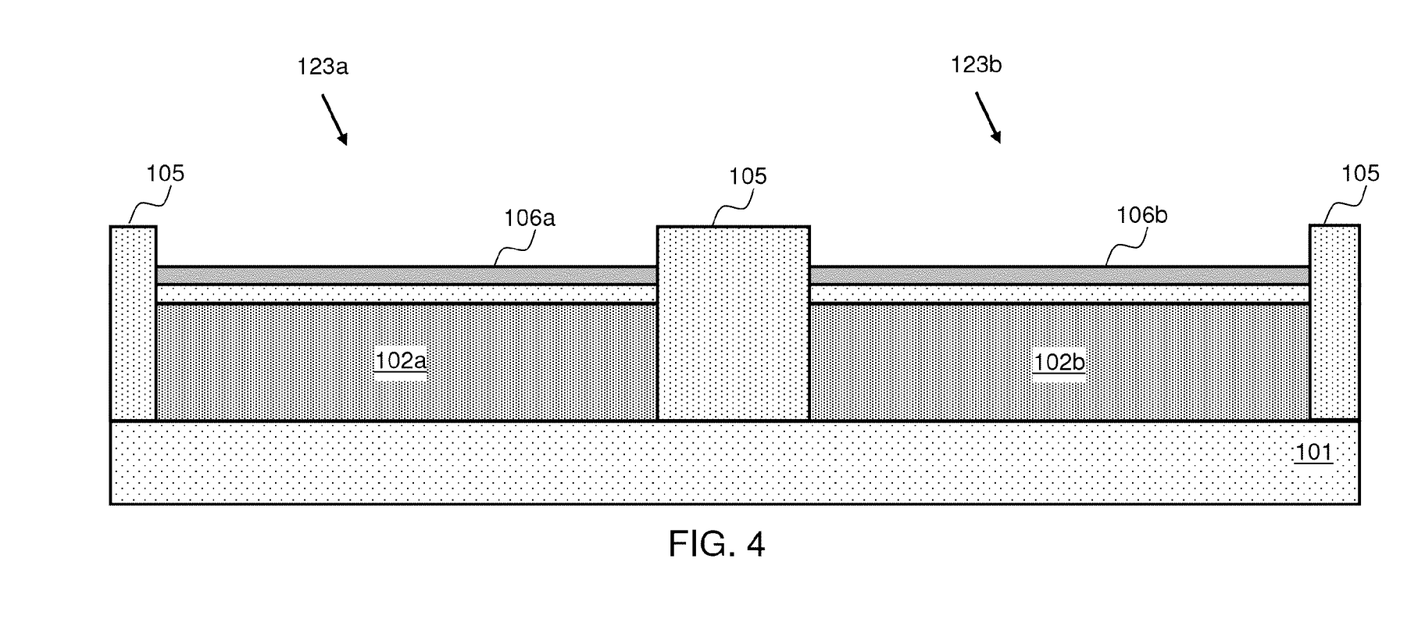
FIG. 4 is a demonstrative illustration of a method of forming one or more transistors, following the steps shown in FIG. 3, according to one embodiment of the present invention.

FIG. 4 is a demonstrative illustration of a method of forming one or more transistors, following the steps shown in FIG. 3, according to one embodiment of the present invention. Following the formation of STIs 105 between the transistor regions, pad nitride layers such as 104a and 104b that are on top of the transistor regions 123a and 123b may be stripped off or removed by any known or existing techniques. The removal of pad nitride layers 104a and 104b may deglaze and expose underneath pad oxide layers 103a and 103b, and may cause STI regions 105 to protrude and have a height higher than that of pad oxide layers 103a and 103b.

After pad nitride layers 104a and 104b are removed, well implantation may be performed in the transistor regions 123a and 123b of silicon layer 102a and 102b. The dopants being implanted may depend upon the type of field-effect-transistors (FET), such as p-FET or n-FET, to be formed therein. Following the well implantation, high-k dielectric layers 106a and 106b may be formed on top of oxide layers 103a and 103b as part of a process of forming high-k metal gate. According to one embodiment, the method ensures that the height of STI regions 105 is kept higher than that of high-k dielectric layers 106a and 106b, after their deposition, in such a way that spacers may be formed at the exposed sidewalls of STI regions 105, as being described below in more details with reference to FIG. 7.

Figure 5:
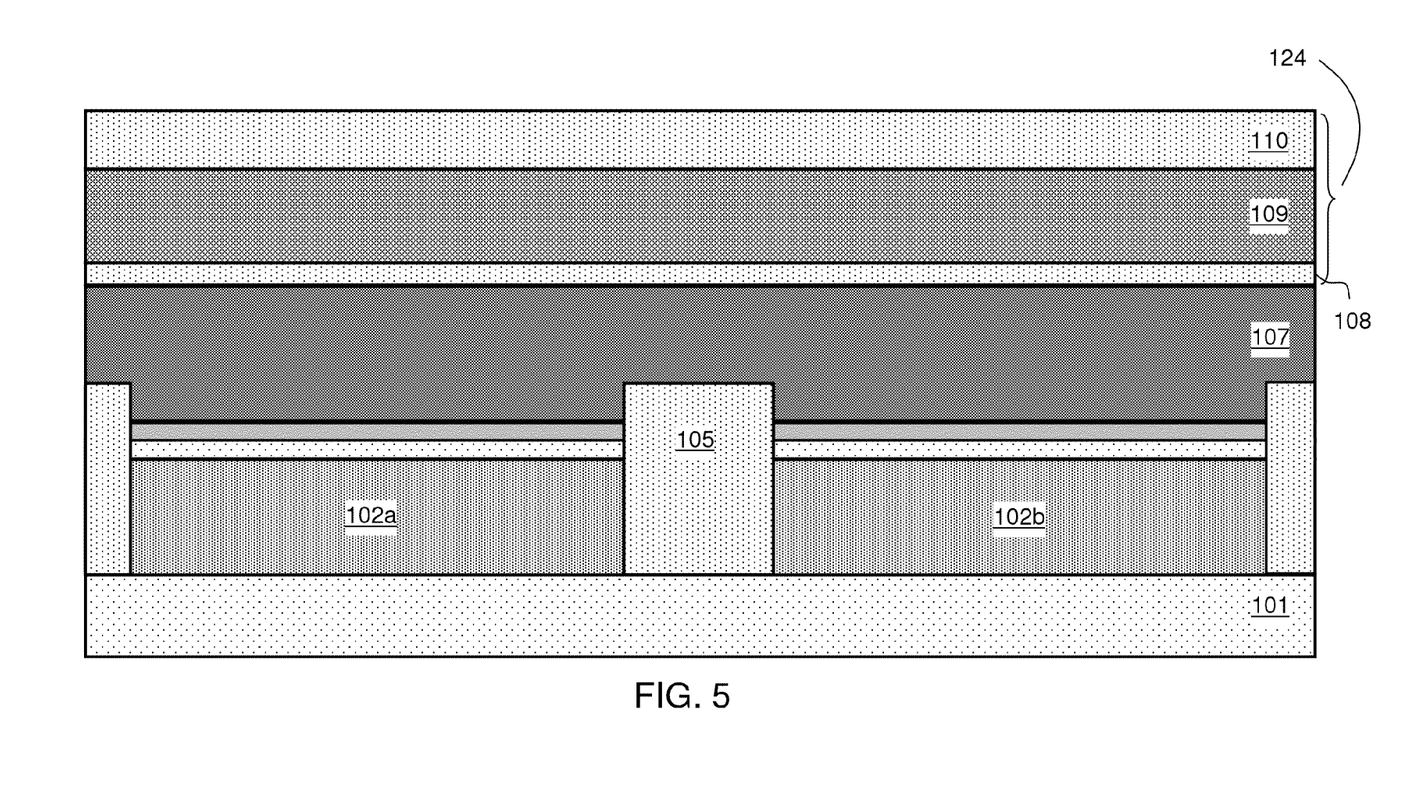
FIG. 5 is a demonstrative illustration of a method of forming one or more transistors, following the steps shown in FIG. 4, according to one embodiment of the present invention.

FIG. 5 is a demonstrative illustration of a method of forming one or more transistors, following the steps shown in FIG. 4, according to one embodiment of the present invention. After depositing high-k dielectric layers 106a and 106b on top of oxide layers 103a and 103b in their respective transistor regions 123a and 123b, a stack of layer or layers that may be suitable as materials of forming a gate stack of transistors, or forming a dummy gate stack as in a replacement gate process, may be deposited on top of high-k dielectric layers 106a and 106b. For example, according to one embodiment, a layer of amorphous-silicon layer 107 may be blanket deposited to cover high-k dielectric layers 106a and 106b and their surrounding STI regions 105. The thickness of amorphous-silicon layer 107 may be determined depending upon particulars of the gate formation process. In one embodiment, a thickness of approximate 450~550A may be deposited.

In order to pattern gate stacks for the one or more transistors, according to one embodiment of the present invention an integrated hard mask layer 124 may be formed on top of amorphous-silicon layer 107. In one embodiment, the integrated hard mask layer 121 may include, for example, an oxide layer 108 of approximate 40~60 A in thickness, a nitride layer 109 of approximate 380~400 A in thickness on top of oxide layer 108, and another oxide layer 110 of approximate 190~210 A in thickness on top of nitride layer 109. The integrated hard mask layer 124 may be formed by, for example, a chemical-vapor-deposition process, for example, by applying a Novellus™ PECVD chamber or other suitable CVD or Plasma-Enhanced CVD equipment.

Figure 6:
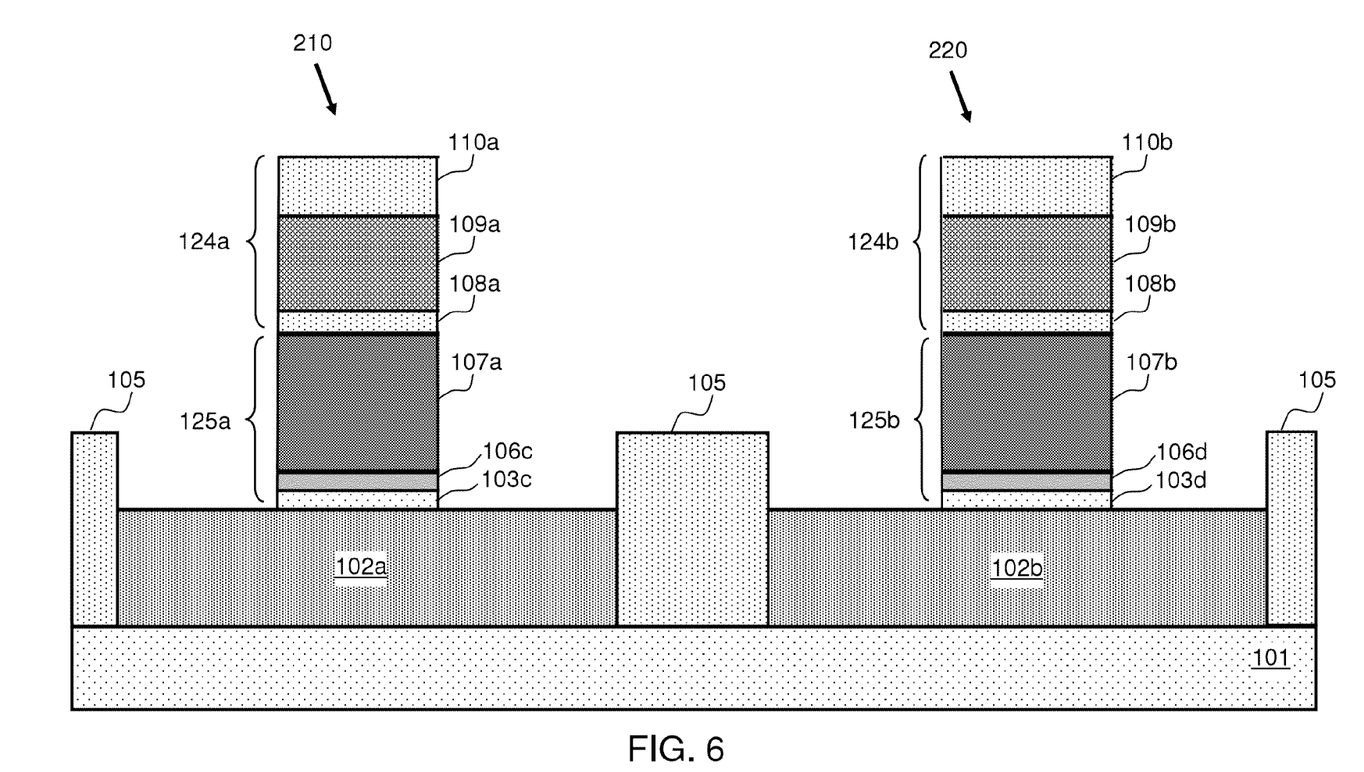
FIG. 6 is a demonstrative illustration of a method of forming one or more transistors, following the steps shown in FIG. 5, according to one embodiment of the present invention.

FIG. 6 is a demonstrative illustration of a method of forming one or more transistors, following the steps shown in FIG. 5, according to one embodiment of the present invention. Following the formation of the integrated hard mask layer 124, in one embodiment, the method may include performing a gate patterning (PC patterning) process to first create one or more hard masks having gate stack patterns, and then apply the hard masks of gate stack patterns to create gate stacks out of the stacked layers of materials underneath the integrated hard mask layer 124. More specifically, as being illustrated in FIG. 6, hard masks 124a and 124b may first be formed or made out of integrated hard mask layer 124 through, for example, a photo-lithographic patterning process. The hard masks 124a and 124b may include oxide layer 108a, nitride layer 109a, and oxide layer 110a for a first transistor 210 and oxide layer 108b, nitride layer 109b, and oxide layer 110b for a second transistor 220, wherein layers 108a and 108b are part of layer 108; layers 109a and 109b are part of layer 109; and layers 110a and 110b are part of layer 110. The hard masks 124a and 124b may then be used in a directional etching process, such as a reactive-ion-etching (RIE) process among many other currently available or future developed techniques, to etch amorphous-silicon layer 107, high-k dielectric layer 106a, and oxide layer 103a into a gate stack 125a that includes layers 107a, 106c, and 103c; and etch amorphous-silicon layer 107, high-k dielectric layer 106b, and oxide layer 103b into a gate stack 125b that includes layers 107b, 106d, and 103d.

Figure 7:
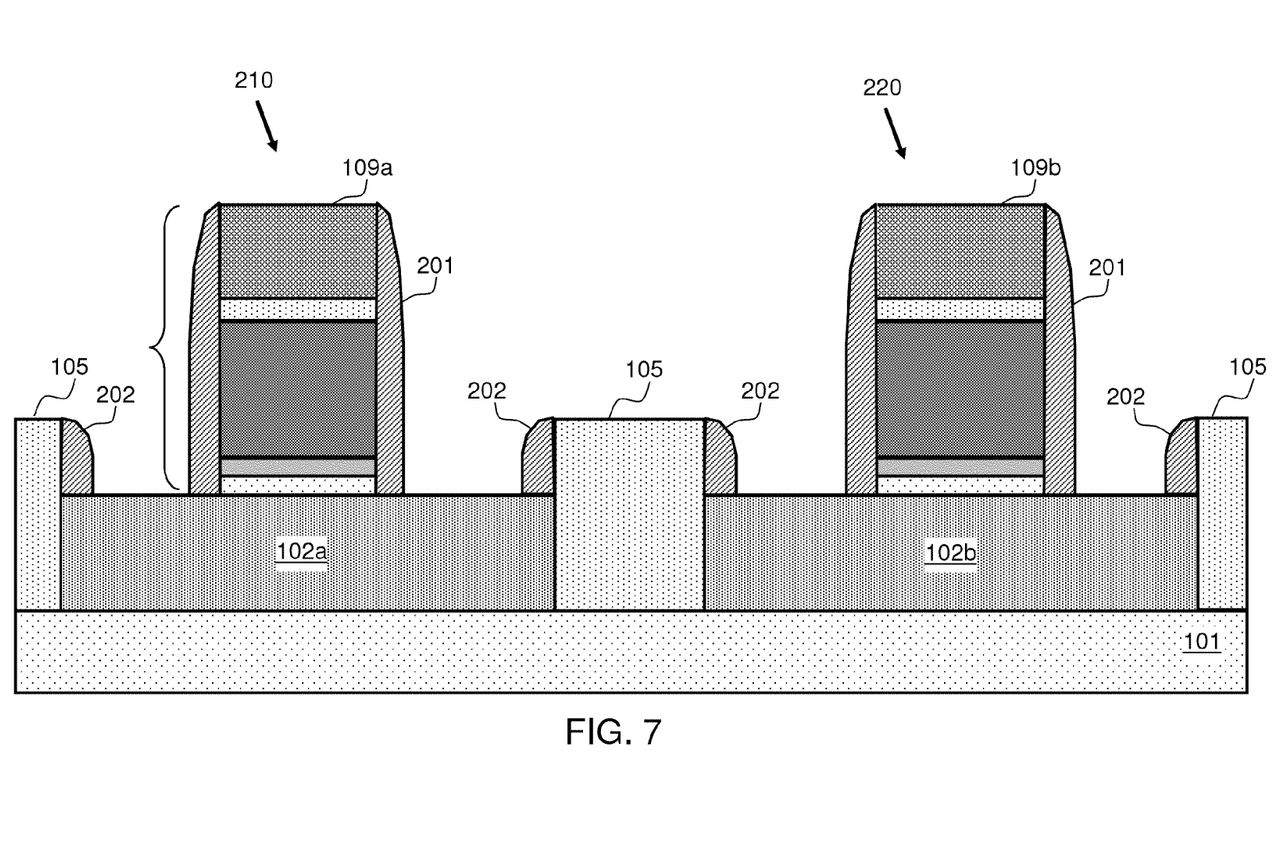
FIG. 7 is a demonstrative illustration of a method of forming one or more transistors, following the steps shown in FIG. 6, according to one embodiment of the present invention.

FIG. 7 is a demonstrative illustration of a method of forming one or more transistors, following the steps shown in FIG. 6, according to one embodiment of the present invention. Following the step of forming gate stacks as is illustrated in FIG. 6, a hard mask opening RIE process may be followed. In this process, in one embodiment, a portion of integrated hard masks 124a and 124b may be removed. For example, oxide layer 110a and 110b at the top of integrated hard masks 124a and 124b may be removed or lifted. In other words, during the PC integrated hard mask opening RIE step, which may be embedded in the PC stack RIE process, the top oxide film (110a and 110b) may be consumed.

According to embodiment of the present invention, the method may include a step of forming spacers at sidewalls of gate stacks 125a and 125b (including remaining portion of integrated hard masks 124a and 124b) and sidewalls of protruding STI regions 105. The formation of spacers may be accomplished by first depositing a conformal layer of material, preferably dielectric material, covering PC nitride hard mask (109a and 109b) that are on top of gate stacks 125a and 125b, and covering STI regions 105, and then etching the conformal dielectric layer in a directional etching process (such as a RIE process) to remove most of the conformal dielectric layer materials except those next to sidewalls of gate stacks and STI regions. As is shown in FIG. 7, sidewall spacers 201 may be formed next to sidewalls of gate stacks 125a and 125b and sidewall spacers 202 may be formed next to a portion of sidewalls of STI regions 105 that are above silicon layer 102a and 102b.

Figure 8:
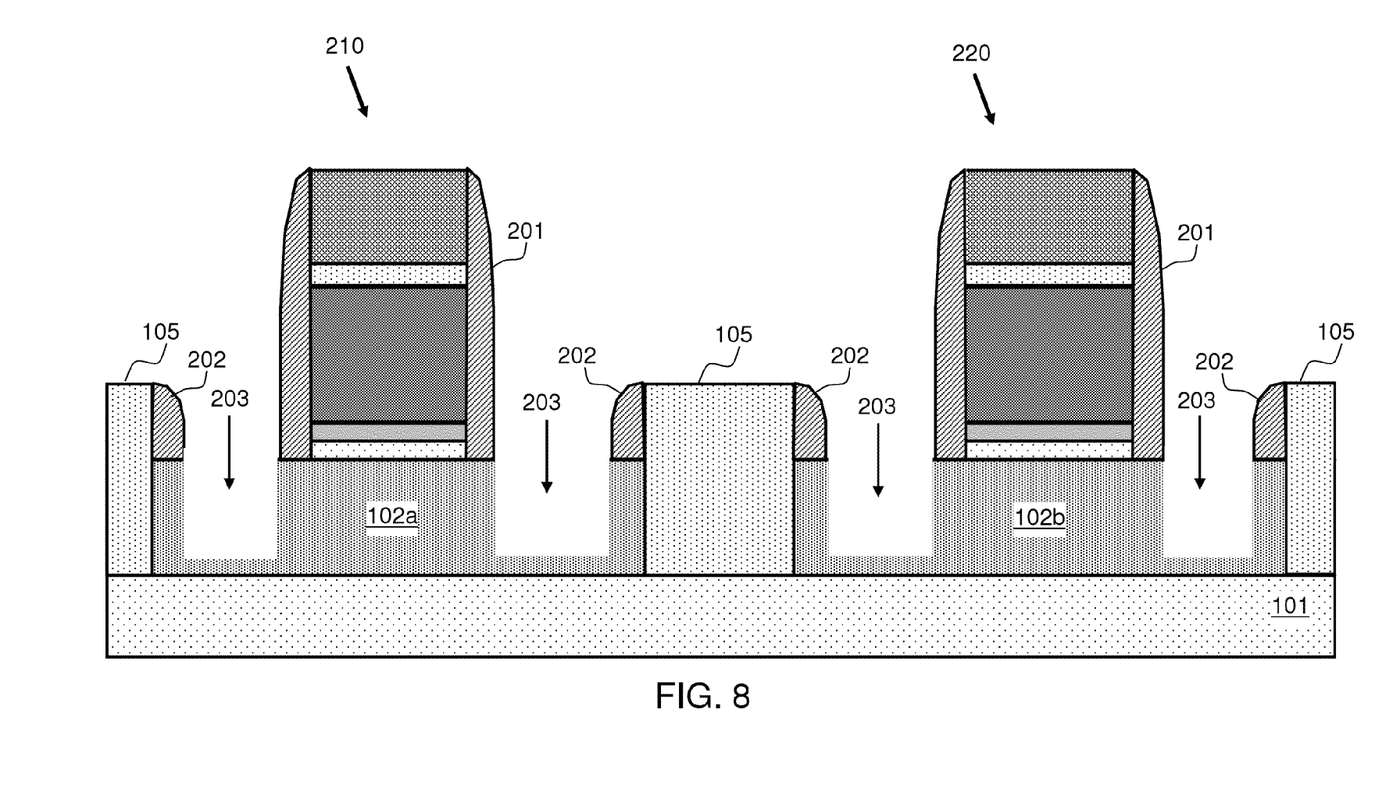
FIG. 8 is a demonstrative illustration of a method of forming one or more transistors, following the steps shown in FIG. 7, according to one embodiment of the present invention.

FIG. 8 is a demonstrative illustration of a method of forming one or more transistors, following the steps shown in FIG. 7, according to one embodiment of the present invention. With sidewall spacers 202 protecting at least a portion of silicon layer 102a and 102b directly underneath spacers 202 and directly next to STI regions 105, according to one embodiment, the source and drain regions of transistors 210 and 220 may be etched to create recesses 203. Recesses 203 may be made entirely within silicon layer 102a and 102b with all sidewalls being covered by silicon material. In other words, with spacers 202 protecting the portion of silicon layer 102a and 102b directly underneath thereof, no dielectric sidewalls of STI regions 105 that are next to silicon layers 102a and 102b are exposed by the etching. As a result, dielectric sidewalls of STI regions 105 are covered by a "sliver" of silicon material of silicon layer 102a and 102b, which serve as a "template" for subsequent epitaxial growth of source and drain of transistors 210 and 220. Recesses 203 may also be made in such a way that they do not expose underneath oxide layer 101 either.

Figure 9:
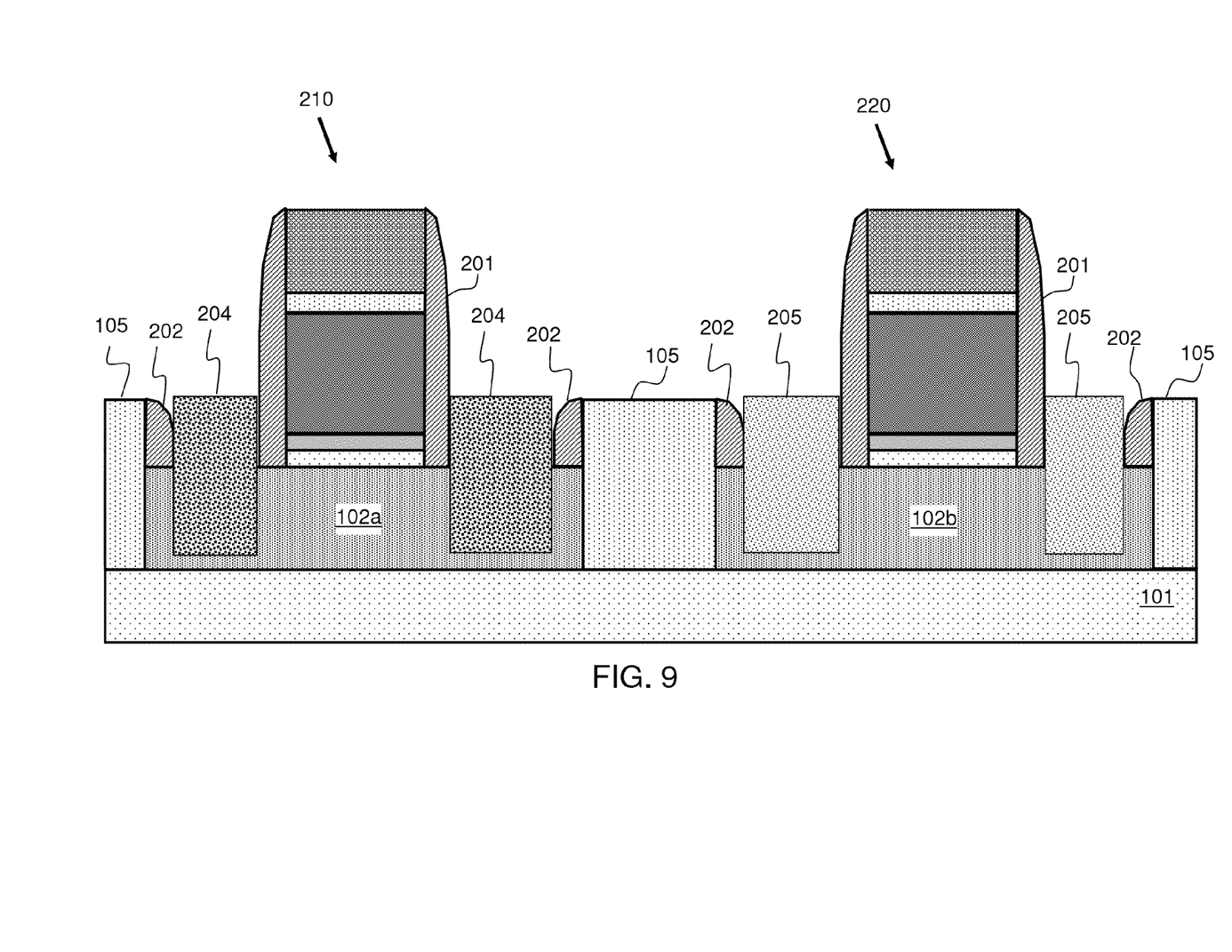
FIG. 9 is a demonstrative illustration of a method of forming one or more transistors, following the steps shown in FIG. 8, according to one embodiment of the present invention.

FIG. 9 is a demonstrative illustration of a method of forming one or more transistors, following the steps shown in FIG. 8, according to one embodiment of the present invention. After the creation of recesses in the source and drain regions of transistors 210 and 220, semiconductor material may be epitaxially grown in the recesses 203 to form source and drain of the transistors. For example, for forming a p-FET transistor 210, source and drain 204 of germanium-silicon may be epitaxially grown in recesses 203 next to the channel region of transistor 210; and for forming an n-FET transistor 220, source and drain 205 of silicon-carbide may be epitaxially grown in recesses 203 next to the channel region of transistor 220. According to one embodiment, because sidewalls of STI regions 105 are now covered by a sliver of silicon material, as compared to being exposed in prior art, a much uniform epitaxial growth of source and drain may be obtained, resulting in reduced device performance variation and enhanced stress effect to the device channel regions.

Following the formation of embedded source/drain through epitaxial growth, conventional transistor forming process may follow. For example, in a replacement metal gate process, dummy gate may be opened and replaced with work-function metal and other metal gate materials.

While the invention has been described in terms of exemplary embodiments, those skilled in the art will recognize that the invention can be practiced with modifications and in the spirit and scope of the appended claims.

What is claimed is:

1. A method of forming a transistor, comprising:
   creating a transistor region in a substrate; said transistor region being separated from rest of said substrate, by one or more shallow trench isolation (STI) regions formed in said substrate, to include a channel region, a source region, and a drain region; said STI regions having a height higher than said transistor region of said substrate;
   forming a gate stack on top of said channel region and, after forming said gate stack, forming spacers at sidewalls of both said gate stack and said STI regions above said transistor region;
   creating recesses in said source region and said drain region with said spacers preserving at least a portion of material of said substrate underneath said spacers along sidewalls of said STI regions; and
   epitaxially growing source and drain of said transistor in said recesses.

2. The method of claim 1, wherein said substrate is a silicon-on-insulator (SOI) substrate having a silicon layer on top of an oxide layer, wherein creating said transistor region further comprises:
   depositing one or more layers on top of said silicon layer of said SOI substrate;
   creating one ore more openings into said one or more layers as well as into said silicon layer of said SOI substrate underneath said one or more layers; and
   filling said one or more openings with oxide to create said one ore more STI regions.

3. The method of claim 2, wherein filling said one or more openings further comprises:
   depositing oxide into said one or more openings until said oxide in said openings has a height higher than said one or more layers, wherein said depositing also causes oxide being deposited on top of said one or more layers; and
   applying a chemical-mechanical-polishing (CMP) process in removing said oxide on top of said one or more layers, wherein said CMP process stops at said one or more layers thereby creating a top surface of said STI regions that is coplanar with said one or more layers.

4. The method of claim 3, wherein creating said transistor region further comprises removing portions of said one or more layers that is on top of said source and drain regions of said transistor region, said source and drain regions being adjacent to said STI regions.

5. The method of claim 4, wherein creating said transistor region further comprises:
   depositing a layer of gate material on top of said one or more layers;
   depositing a hard mask layer on top of said layer of gate material;
   patterning said hard mask layer into a gate pattern; and
   forming a gate stack by transferring said gate pattern into said layer of gate material and said one or more layers underneath said layer of gate material,
   wherein said gate stack is formed on top of said channel region.

6. The method of claim 5, wherein said hard mask layer is an integrated hard mask layer that includes a first oxide layer, a nitride layer on top of said first oxide layer, and a second oxide layer on top of said nitride layer.

7. The method of claim 6, wherein forming said spacers further comprises:
   removing said second oxide layer of said integrated hard mask layer;
   depositing a conformal dielectric layer covering said nitride layer of said integrated hard mask layer, said source and drain regions, and said STI regions; and
   applying a directional etching process in transforming said conformal dielectric layer into spacers at sidewalls of said STI regions.

8. The method of claim 2, wherein at least one of said one or more layers on top of said SOI substrate is a high-k dielectric layer.

9. The method of claim 2, wherein epitaxially growing said source and drain of said transistor comprises growing either silicon-germanium (SiGe) or silicon-carbide (SiC) on top of silicon material of said silicon layer of said SOI substrate, wherein said STI regions are not exposed at sidewalls of said recesses.

10. A method of forming a transistor, comprising:
    forming a gate stack on top of a transistor region of a substrate, said transistor region of said substrate including a channel region, a source region, and a drain region, said channel region being underneath said gate stack, said source region being between said channel region and a first shallow trench insulation (STI) region, and said drain region being between said channel region and a second STI region, and said first and second STI regions having a height higher than said region of said substrate;
    subsequent to forming said gate stack, forming spacers at sidewalls of both said gate stack and said first and second STI regions above said substrate;
    creating recesses in said source region and said drain region, with said spacers preserving at least a portion of said substrate along sidewalls of said first and second STI regions underneath said spacers;
    epitaxially growing source and drain of said transistor in said recesses.

11. The method of claim 10, wherein said epitaxially growing source and drain comprises growing said source and said drain on sidewalls of said recesses of material of said substrate, wherein said first and second STI regions being covered by said material of said substrate inside said recesses.

12. The method of claim 11, wherein said substrate is a silicon-on-insulator (SOI) substrate having a silicon layer on top of an oxide layer, wherein forming said gate stack further comprises:
- depositing one or more layers on top of said silicon layer of said SOI substrate;
- creating one ore more openings into said one or more layers as well as into said silicon layer of said SOI substrate underneath said one or more layers; and
- filling said one or more openings with oxide to create said first and second STI regions.

13. The method of claim 12, wherein filling said one or more openings further comprises:
- depositing oxide into said one or more openings until said oxide in said openings has a height higher than said one or more layers, wherein said depositing also causes oxide being deposited on top of said one or more layers; and
- applying a chemical-mechanical-polishing (CMP) process in removing said oxide on top of said one or more layers, wherein said CMP process stops at said one or more layers thereby creating a top surface of said first and second STI regions that is coplanar with said one or more layers.

14. The method of claim 13, wherein forming said gate stack further comprises removing portions of said one or more layers that is on top of said source and drain regions of said transistor region and adjacent to said first and second STI regions.

15. The method of claim 14, wherein forming said gate stack further comprises:
- depositing a layer of gate material on top of said one or more layers;
- depositing an integrated hard mask layer on top of said layer of gate material;
- patterning said integrated hard mask layer into a gate pattern; and
- forming a gate stack by transferring said gate pattern into said layer of gate material and said one or more layers underneath said layer of gate material,
- wherein said gate stack is formed on top of said channel region and wherein said integrated hard mask layer comprises a first oxide layer, a nitride layer on top of said first oxide layer, and a second oxide layer on top of said nitride layer.

16. The method of claim 15, wherein forming said spacers further comprises:
- removing said second oxide layer of said integrated hard mask layer;
- depositing a conformal dielectric layer covering said nitride layer of said integrated hard mask layer, said source and drain regions, and said first and second STI regions; and
- applying a directional etching process in transforming said conformal dielectric layer into spacers at sidewalls of said first and second STI regions.

17. A method comprising:
creating a plurality of transistor regions of a substrate, said transistor regions being separated by one or more shallow trench isolation (STI) regions formed in said substrate and including a channel region, a source region, and a drain region, wherein said one or more STI regions have a height higher than a top surface of said substrate;
forming a gate stack on top of said channel region;
depositing a conformal dielectric layer on top of said gate stack, said source and drain regions of said substrate, and said one or more STI regions;
directionally etching said conformal dielectric layer into spacers at sidewalls, at above said surface of said substrate, of said one or more STI regions;
creating recesses in said source region and said drain region with said spacers preserving at least a portion of material of said substrate along sidewalls at below said surface of said substrate, of said one or more STI regions; and
epitaxially growing source and drain of said transistor in said recesses,
wherein said substrate is a silicon-on-insulator (SOI) substrate having a silicon layer on top of an oxide layer, wherein creating said plurality of transistor regions of said substrate further comprises:
- depositing one or more layers on top of said silicon layer of said SOI substrate;
- creating one ore more openings into said one or more layers as well as into said silicon layer of said SOI substrate underneath said one or more layers; and
- filling said one or more openings with oxide to create said one ore more STI regions, wherein forming said gate stack further comprises:
- depositing a layer of gate material on top of said one or more layers;
- depositing an integrated hard mask layer on top of said layer of gate material;
- patterning said integrated hard mask layer into a gate pattern; and
- forming a gate stack by transferring said gate pattern into said layer of gate material and said one or more layers underneath said layer of gate material and removing portions of said one or more layers that is on top of said source and drain regions of said substrate, said source and drain regions being adjacent to said one or more STI regions,
wherein said gate stack is formed on top of said channel region; said integrated hard mask comprises a first oxide layer, a nitride layer on top of said first oxide layer, and a second oxide layer on top of said nitride layer; and at least one of said one or more layers on top of said SOI substrate is a high-k dielectric layer.

* * * * *